(12) United States Patent
Hodge, Jr.

(10) Patent No.: US 11,777,450 B2
(45) Date of Patent: Oct. 3, 2023

(54) APPARATUS FOR OPTIMIZED TURN-OFF OF A CASCODE AMPLIFIER

(71) Applicant: Silanna Asia Pte Ltd, Singapore (SG)

(72) Inventor: Stuart Ide Hodge, Jr., Palm Coast, FL (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 18/057,538

(22) Filed: Nov. 21, 2022

(65) Prior Publication Data
US 2023/0086201 A1   Mar. 23, 2023

Related U.S. Application Data

(63) Continuation of application No. 17/247,033, filed on Nov. 24, 2020, now Pat. No. 11,527,998, which is a
(Continued)

(51) Int. Cl.
*H03F 1/02* (2006.01)
*H03F 3/45* (2006.01)

(52) U.S. Cl.
CPC ....... *H03F 1/0222* (2013.01); *H03F 3/45179* (2013.01); *H03F 3/45376* (2013.01);
(Continued)

(58) Field of Classification Search
CPC .................................................. H03F 1/0222
See application file for complete search history.

(56) References Cited

U.S. PATENT DOCUMENTS

| 4,241,316 A | * | 12/1980 | Knapp | H03F 3/165 330/277 |
|---|---|---|---|---|
| 4,463,385 A | | 7/1984 | Parker | |

(Continued)

FOREIGN PATENT DOCUMENTS

| KR | 100870895 B1 | 11/2008 |
|---|---|---|
| KR | 101798042 B1 | 11/2017 |

OTHER PUBLICATIONS

Bhalla et al., "Switching Behavior of USCi's SiC Cascodes," Bodo's Power Systems, www.bodospower.com, Jun. 2015, pp. 22-26.
(Continued)

*Primary Examiner* — Patricia T Nguyen
(74) *Attorney, Agent, or Firm* — MLO, a professional corp.

(57) ABSTRACT

An apparatus for turning off a cascode amplifier having a common-gate transistor and a common-source transistor is disclosed that includes the cascode amplifier, a feedback circuit, and a bias circuit. The feedback circuit is configured to receive a drain-voltage from the drain of the common-source transistor when the common-source transistor is switched to a first OFF state and produce a first feedback signal. The drain-voltage is equal to a source voltage of the common-gate transistor and the drain-voltage increases in response to switching the common-source transistor to the first OFF state. The bias circuit is configured to receive the first feedback signal and produce a bias-voltage. A first gate-voltage is produced from the bias-voltage. The cascode amplifier is configured to receive the first gate-voltage and a second gate-voltage. The common-gate transistor is configured to switch to a second OFF state in response to receiving the second gate-voltage.

11 Claims, 8 Drawing Sheets

US 11,777,450 B2
Page 2

Related U.S. Application Data continuation of application No. 16/243,923, filed on Jan. 9, 2019, now Pat. No. 10,862,429.

(52) U.S. Cl.
CPC .............. *H03F 2200/129* (2013.01); *H03F 2203/45116* (2013.01); *H03F 2203/45528* (2013.01)

(56) References Cited

U.S. PATENT DOCUMENTS

| | | | |
|---|---|---|---|
| 4,660,093 A | 4/1987 | Craig et al. | |
| 5,061,903 A | 10/1991 | Vasile | |
| 5,748,040 A | 5/1998 | Leung | |
| 6,184,750 B1 | 2/2001 | Somerville | |
| 7,560,994 B1 | 7/2009 | Lee et al. | |
| 7,768,352 B2 | 8/2010 | Sutardja | |
| 8,081,033 B2 | 12/2011 | Kim et al. | |
| 9,048,837 B2 | 6/2015 | Hirose | |
| 9,083,343 B1 | 7/2015 | Li et al. | |
| 9,438,175 B2 | 9/2016 | Onizuka | |
| 9,444,416 B1 | 9/2016 | Bisby | |
| 9,614,496 B1 * | 4/2017 | Cowles | H03H 11/1213 |
| 10,503,187 B1 | 12/2019 | Hodge, Jr. | |
| 10,938,349 B1 | 3/2021 | Ayranci et al. | |
| 11,262,782 B2 | 3/2022 | Aksin et al. | |
| 2005/0007195 A1 | 1/2005 | Schrader | |
| 2006/0044071 A1 | 3/2006 | Hairston | |
| 2007/0070659 A1 | 3/2007 | Sawtell | |
| 2008/0197908 A1 | 8/2008 | Williams | |
| 2009/0273399 A1 | 11/2009 | Wang | |
| 2012/0133398 A1 | 5/2012 | Draxelmayr | |
| 2012/0262220 A1 | 10/2012 | Springett | |
| 2013/0093520 A1 | 4/2013 | Roux et al. | |
| 2013/0234621 A1 | 9/2013 | Athalye | |
| 2015/0200583 A1 | 7/2015 | Huang et al. | |
| 2020/0036341 A1 * | 1/2020 | Klaren | H03F 1/223 |
| 2020/0313626 A1 | 10/2020 | Ding | |
| 2021/0075376 A1 * | 3/2021 | Birkbeck | H03F 3/45071 |
| 2022/0368286 A1 * | 11/2022 | Pessa | H03F 1/223 |
| 2022/0407469 A1 * | 12/2022 | Ayranci | H03F 3/505 |

OTHER PUBLICATIONS

Heldwein et al., "A novel SiC J-FET gate drive circuit for sparse matrix converter applications," Swiss Federal Institute of Technology, Zurich, Power Electronic Systems Laboratory, Feb. 2004.
International Search Report dated Apr. 22, 2020 for PCT Patent Application No. PCT/IB2020/050056.
Notice of Allowance and Fees dated Aug. 19, 2022 for U.S. Appl. No. 17/247,033.
Notice of Allowance dated Aug. 20, 2020 for U.S. Appl. No. 16/243,923.
Office Action dated Apr. 28, 2022 for U.S. Appl. No. 17/247,033.
Office Action dated May 1, 2020 for U.S. Appl. No. 16/243,923.
Official Letter and Search Report dated Jun. 12, 2023 for Taiwan Patent Application No. 108146706.

* cited by examiner

APPARATUS FOR OPTIMIZED TURN-OFF OF A CASCODE AMPLIFIER

CROSS-REFERENCE TO RELATED APPLICATION

This application is a continuation of U.S. Non-Provisional application Ser. No. 17/247,033, filed Nov. 24, 2020, which is a continuation of U.S. Non-Provisional application Ser. No. 16/243,923, filed Jan. 9, 2019, all of which are incorporated by reference herein in their entirety.

BACKGROUND

At present, the existence and use of powered electronic devices has become commonplace. Modern power supplies are utilized to power or charge many of these powered electronic devices. Generally, in modern power supply designs, it is useful to switch the voltage and current utilized by the power supply in a manner that achieves a step down or step up in voltage. This switching creates a new average output voltage for the power supply based on, in some examples, the duty cycle of the switching. In such example, the power supply switching device is mainly either in an "ON" or an "OFF" state. During these two states, the power loss in the power supply switching device is a function of the current flowing in the power supply and the resistance of the power supply. In addition, there is a "switching loss" associated with moving the power supply switching device from the ON state to the OFF state and from the OFF state to the ON state. In general, the switching loss is caused by the voltage rising or falling while current is flowing in the power supply. As such, there is a need for an apparatus and method that reduces the power loss of the apparatus by reducing the switching losses of the apparatus.

SUMMARY

Disclosed is an apparatus for turning off a cascode amplifier having a common-gate transistor and a common-source transistor. The apparatus includes the cascode amplifier, a feedback circuit, and a bias circuit. In the cascode amplifier, common-gate transistor includes a source that is in signal communication with a drain of the common-source transistor. The feedback circuit is in signal communication with the source of the common-gate transistor and the drain of the common-source transistor, where the feedback circuit is configured to receive a drain-voltage from the drain of the common-source transistor when the common-source transistor is switched to a first OFF state and produce a first feedback signal. The drain-voltage is equal to a source voltage of the common-gate transistor and the drain-voltage increases in response to switching the common-source transistor to the first OFF state. The bias circuit is in signal communication with a gate of the common-gate transistor and the feedback circuit and is configured to receive the first feedback signal and produce a bias-voltage. A first gate-voltage is produced from the bias-voltage. The cascode amplifier is configured to receive the first gate-voltage at the gate of the common-gate transistor, where the first gate-voltage increases as the drain-voltage increases. The cascode amplifier is also configured to receive a second gate-voltage at the gate of the common-gate transistor and the common-gate transistor is configured to switch to a second OFF state in response to receiving the second gate-voltage at the gate of the common-gate transistor.

In an example of operation, the apparatus performs a method that includes switching the common-source transistor to the first OFF state, where the drain-voltage increases at the drain of the common-source transistor in response to switching the common-source transistor to the first OFF state, and producing the bias-voltage from the drain-voltage with the bias circuit. The method also includes injecting a first gate-voltage at a gate of the common-gate transistor, where the first gate-voltage is related to the bias-voltage and the first gate-voltage increases as the drain-voltage increases. The method further includes injecting a second gate-voltage at the gate of the common-gate transistor and switching the common-gate transistor to a second OFF state in response to injecting the second gate-voltage at the gate of the common-gate transistor.

Other devices, apparatuses, systems, methods, features, and advantages of the invention will be or will become apparent to one with skill in the art upon examination of the following figures and detailed description. It is intended that all such additional devices, apparatuses, systems, methods, features, and advantages be included within this description, be within the scope of the invention, and be protected by the accompanying claims.

BRIEF DESCRIPTION OF THE DRAWINGS

The disclosure may be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

In the following description, like reference numbers are used to identify like elements. Furthermore, the drawings are intended to illustrate major features of example embodiments in a diagrammatic manner. The drawings are not intended to depict every feature of actual embodiments.

An apparatus for turning off a cascode amplifier having a common-gate transistor and a common-source transistor is disclosed. The apparatus includes the cascode amplifier, a feedback circuit, and a bias circuit. In the cascode amplifier, the common-gate transistor includes a source that is in signal communication with a drain of the common-source transistor. The feedback circuit is in signal communication with the source of the common-gate transistor and the drain of the common-source transistor, where the feedback circuit is configured to receive a drain-voltage from the drain of the common-source transistor when the common-source transistor is switched to a first OFF state and produce a first feedback signal. The drain-voltage is equal to a source voltage of the common-gate transistor and the drain-voltage increases in response to switching the common-source transistor to the first OFF state. The bias circuit is in signal communication with a gate of the common-gate transistor and the feedback circuit and is configured to receive the first feedback signal and produce a bias-voltage. A first gate-voltage is produced from the bias-voltage. The cascode amplifier is configured to receive the first gate-voltage at the gate of the common-gate transistor. The first gate-voltage increases as the drain-voltage increases. The cascode amplifier is also configured to receive a second gate-voltage at the gate of the common-gate transistor and the common-gate transistor is configured to switch to a second OFF state in response to receiving the second gate-voltage at the gate of the common-gate transistor.

In an example of operation, the apparatus performs a method that includes switching the common-source transistor to the first OFF state, where the drain-voltage increases at the drain of the common-source transistor in response to switching the common-source transistor to the first OFF state, and producing the bias-voltage from the drain-voltage with the bias circuit. The method also includes injecting a first gate-voltage at a gate of the common-gate transistor, where the first gate-voltage is related to the bias-voltage and the first gate-voltage increases as the drain-voltage increases. The method further includes injecting a second gate-voltage at the gate of the common-gate transistor and switching the common-gate transistor to a second OFF state in response to injecting the second gate-voltage at the gate of the common-gate transistor.

Figure 1:
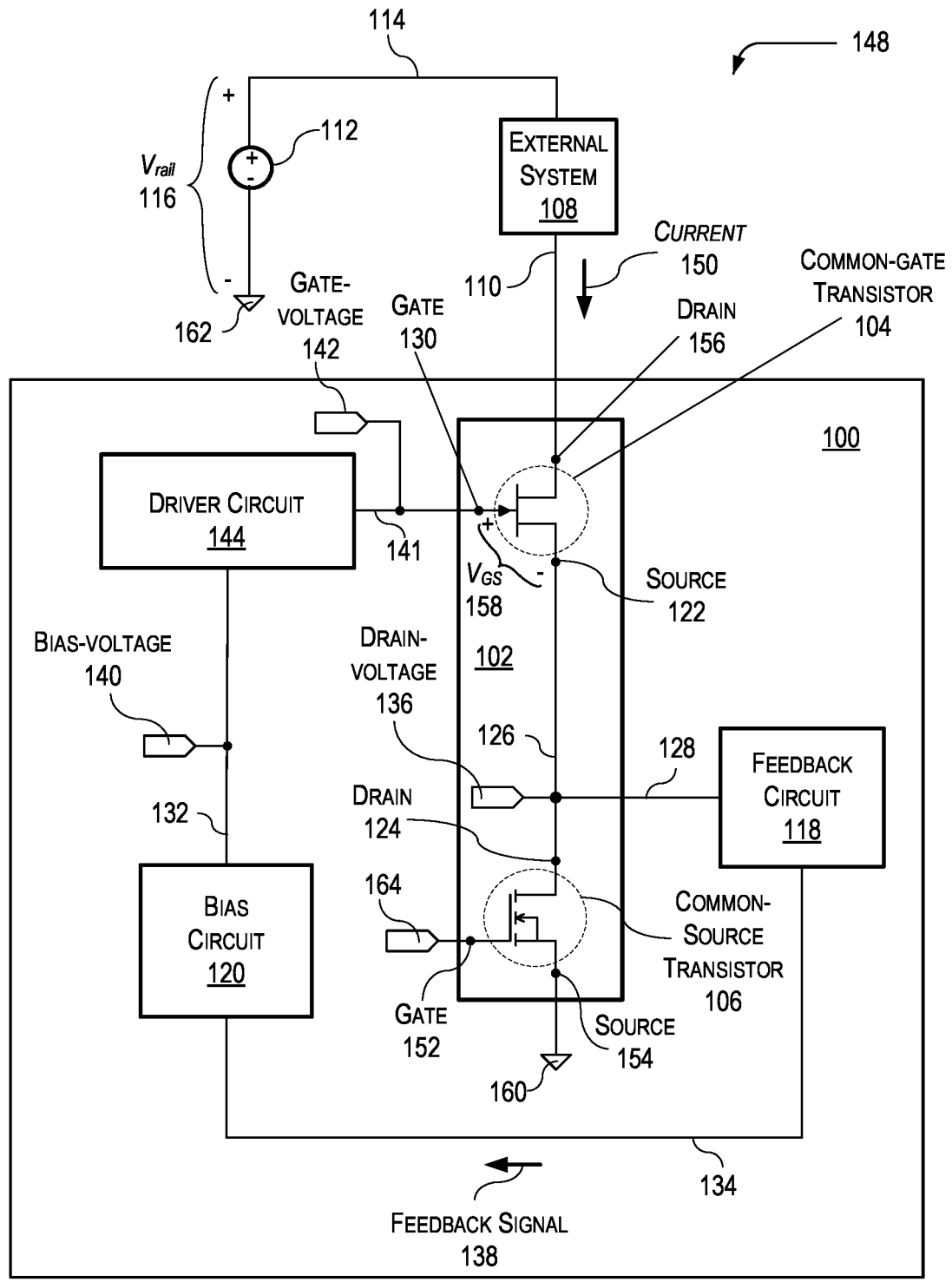
In FIG. 1 is a system diagram of an example of an implementation of an apparatus for turning off a cascode amplifier in accordance with the present disclosure.

In FIG. 1, a system diagram is shown of an example of an implementation of an apparatus 100 for turning off a cascode amplifier 102 in accordance with the present disclosure. The cascode amplifier 102 includes a common-gate transistor 104 and a common-source transistor 106. The apparatus 100 is in signal communication with an external system 108 via signal path 110. In this example, the external system 108 may be another circuit, module, component, device, or system that is in signal communication with a reference direct current ("DC") voltage source 112, via signal path 114, that provides a rail-voltage 116 ("$V_{rail}$") to the external system 108.

The apparatus 100 includes the cascode amplifier 102, a feedback circuit 118, and bias circuit 120. The cascode amplifier 102 includes the common-gate transistor 104 and the common-source transistor 106, where a source 122 of the common-gate transistor 104 is in signal communication with a drain 124 of the common-source transistor 106 via signal path 126. The feedback circuit 118 is in signal communication with the source 122 of the common-gate transistor 104 and the drain 124 of the common-source transistor 106 via signal path 128. The bias circuit 120 is in signal communication with a gate 130 of the common-gate transistor 104 and the feedback circuit 118 via signal paths 132 and 134, respectively. The feedback circuit 118 is configured to receive a drain-voltage 136 from the common-source transistor 106 and produce a feedback signal 138 that is passed to the bias circuit 120 via the signal path 134. The bias circuit 120 is configured to receive the feedback signal 138 and produce a bias-voltage 140. In this example, a gate-voltage 142 of the common-gate transistor is produced by a driver circuit 144 using the bias-voltage 140, and the gate-voltage 142 is injected into the gate 130 of the common-gate transistor 104. In this example, the apparatus 100 and external system 108 may be part of a switching circuit device such as, for example, a power supply 148.

The common-gate transistor 104 and common-source transistor 106 are field-effect transistors ("FETs"). In this example, the common-gate transistor 104 may be an n-type junction field-effect transistor ("JFET") and the common-source transistor 106 may be a metal-oxide-semiconductor field-effect transistor ("MOSFET") (e.g., an enhancement n-type MOSFET).

It is appreciated by those skilled in the art that the circuits, components, modules, and/or devices of, or associated with, the apparatus 100 are described as being in signal communication with each other, where signal communication refers to any type of communication and/or connection between the circuits, components, modules, and/or devices that allows a circuit, component, module, and/or device to pass and/or receive signals and/or information from another circuit, component, module, and/or device. The communication and/or connection may be along any signal path between the circuits, components, modules, and/or devices that allows signals and/or information to pass from one circuit, component, module, and/or device to another and includes wireless or wired signal paths. The signal paths may be physical, such as, for example, conductive wires, electromagnetic wave guides, cables, attached and/or electromagnetic or mechanically coupled terminals, semi-conductive or dielectric materials or devices, or other similar physical connections or couplings. Additionally, signal paths may be non-physical such as free-space (in the case of electromagnetic propagation) or information paths through digital components where communication information is passed from one circuit, component, module, and/or device to another in varying digital formats without passing through a direct electromagnetic connection.

In an example of operation, the apparatus 100 performs a method that includes switching the common-source transistor 106 to the first OFF state (i.e., turning off the common-source transistor 106). As a result of switching the common-source transistor 106 to the first OFF state, the drain-voltage 136 of the common-source transistor 106 begins to rise. Assuming that the common-source transistor 106 is an enhancement n-type MOSFET device, it is appreciated by those of ordinary skill in the art that the amount of time for the drain-voltage 136 to rise is determined by the amount of current 150 flowing into and through the cascode amplifier 102 and the output capacitance of the MOSFET (i.e., the common-source transistor 106) known as $C_{oss}$ that is the small signal output capacitance when the gate 152 and source 154 of the common-source transistor 106 are shorted. In general, the current 150 charges the capacitance of the common-source transistor 106 and the charging time governs the rise time of the drain-voltage 136. In this example, if the load impedance of the external system 108 is low, the current 150 will be a low level current between the drain 156 and source 122 of the common-gate transistor 104 that will take longer to charge the capacitance of the common-source transistor 106.

The method then includes receiving the drain-voltage 136 from the drain 124 of the common-source transistor 106 with the feedback circuit 118 and, in response, producing the feedback signal 138 with the feedback circuit 118. The bias-voltage 140 is produced from the drain-voltage 136 because the bias-voltage 140 is produced from the feedback signal 138 that is itself produced from the drain-voltage 136.

The method also includes injecting a first gate-voltage at the gate 130 of the common-gate transistor 104, where the first gate-voltage is related to the bias-voltage 140 and the first gate-voltage increases as the drain-voltage 136 increases. The method further includes injecting a second gate-voltage at the gate 130 of the common-gate transistor 104 and switching the common-gate transistor 104 to a second OFF state (i.e., turning off the common-gate transistor 104) in response to injecting the second gate-voltage at the gate 130 of the common-gate transistor 104. In this example, the gate-voltage 142 at the gate 130 of the common-gate transistor 104 may be either the first gate-voltage or the second gate-voltage based on whether the driver circuit 144 is switching the common-gate transistor to turn off. If the driver circuit 144 does not turn off the common-gate transistor 104, the driver circuit 144 injects the first gate-voltage (as the gate-voltage 142) into the gate 130 of the common-gate transistor 104. As the first gate-voltage is injected into the gate 130 of the common-gate transistor 104, the gate-voltage increases and tracks the drain-voltage 136 as the drain-voltage 136 increases at the drain 124 of the common-source transistor 106. As such, the gate-to-source voltage ("$V_{GS}$") 158 of the common-gate transistor 104 remains approximately constant for a certain amount of time as the capacitance of the common-gate transistor 104 charges. In this example, the first gate-voltage increases and tracks the drain-voltage 136 as the drain-voltage 136 increases because the first gate-voltage is produced from the bias-voltage 140 that itself increases and tracks the drain-voltage 136. In general, the bias-voltage 140 senses the drain-voltage 136 at the drain 124 of the common-source transistor 106 because the bias-voltage 140 is produced by directly receiving and measuring the drain-voltage 136 with the feedback circuit 118 via signal path 128. Any change in voltage level of the drain-voltage 136 is directly measured and passed by the feedback circuit 118 to the bias circuit 120 that produces the bias-voltage 140 by detecting (i.e., sensing) any changes in the voltage level of the drain-voltage 136. In this example, sensing the drain-voltage 136 may include comparing the feedback signal 138 against a reference voltage within the bias circuit 120.

In this example, the second gate-voltage is less than the first gate-voltage, where the second gate-voltage may be less than the first gate-voltage by a voltage amount that has a magnitude value that is equal to or greater than a threshold voltage ("VT") value of the common-gate transistor 104. In other words, $V_T$ is equal to the voltage value of $V_{GS}$ 158 where the common-gate transistor 104 is pinched off and does not pass the current 150 from the drain 156 to the source 122 of the common-gate transistor 104. In this example, $V_T$ may be equal to approximately 6 volts based on the type of common-gate transistor 104 utilized. As such, the second gate-voltage is less than or equal to first gate-voltage minus $V_T$ such that the first gate-voltage (when injected into the gate 130 of the common-gate transistor 104) will cause the common-gate transistor 104 to turn off because it will be pinched off by the second gate-voltage and will not be able to pass the current 150 from the drain 156 to the source 122 of the common-gate transistor 104. In this example, the first gate-voltage may be the bias-voltage and the second gate-voltage may be independent of the drain-voltage 136 and approximately equal to a ground voltage.

Turning back to the elements of the apparatus 100, in this example, the external system 108 is in signal communication with the drain 156 of the common-gate transistor 104 via signal path 110 and the source 154 of the common-source transistor 106 is in signal communication with a ground connection 160. For ease of illustration, the DC Voltage source 112 is also in signal communication with a ground 162 connection. As described earlier, the external system 108 may be another circuit, module, component, device, or system that is in signal communication with the DC voltage source 112 that provides the $V_{rail}$ 116 to the external system 108. The external system 108 may include, for example, a winding from a switching transformer and other circuitry such as a low-pass filter.

The cascode amplifier 102 (also known as a "cascode") is a two-stage amplifier that includes a common-emitter or common-source stage feeding into a common-base or common-gate stage of the amplifier. In general, a cascode includes two transistors that may be bipolar junction transistors ("BJTs") or field-effect transistors ("FETs"). The cascode improves the input to output isolation and eliminates the Miller effect of the amplifier resulting in an amplifier having a high bandwidth. As already described, in this example, the first and second stages of the cascode amplifier 102 are shown as implemented with FETs that include the common-gate transistor 104 as a JFET and common-source transistor 106 as a MOSFET. The common-gate transistor 104 may be, for example, a Silicon Carbide JFET. In this example, the common-source transistor 106 may be driven by a source that is a pulse width modulated ("PWM") source 164 that is in signal communication with the gate 152 of the common-source transistor 106.

The feedback circuit 118 is a circuit, component, module, or device that receives the drain-voltage 136 and produces the feedback signal 138 that is passed to the bias circuit 120 via signal path 134. In one example, the feedback circuit 118 may be a feedback path that includes signal paths 128 and 134, where the feedback signal 138 is the drain-voltage 136 that is directly passed from the drain 124 of the common-source transistor 106 to the bias circuit 120 via the combined signal paths 128 and 134.

In an alternative example, the feedback circuit 118 may be a circuit that is configured to receive the drain-voltage 136 from the drain 124 of the common-source transistor 106, when the common-source transistor 106 is switched to an OFF state (i.e., a first OFF state), and produce a first feedback signal from the received drain-voltage 136. Moreover, in this example, the feedback circuit 118 may also include circuitry to produce a supply voltage (generally known as a "voltage at the common collector", abbreviated as $V_{CC}$), where $V_{CC}$ is passed to the bias circuit 120 via a second feedback signal. In this example, both the first feedback signal and second feedback signal are part of the feedback signal 138.

In yet another alternative example, the feedback circuit 118 may be, or include, a voltage-doubler circuit in signal communication with the source 122 of the common-gate transistor 104 and the drain 124 of the common-source transistor 106 via the signal path 128. In this example, similar to the previously described example, the feedback circuit 118 is a circuit that is configured to receive the drain-voltage 136 from the drain 124 of the common-source transistor 106, when the common-source transistor 106 is switched to an OFF state (i.e., a first OFF state), and produce a first feedback signal from the received drain-voltage 136.

Moreover, in this example, the feedback circuit 118 may also include a voltage-doubler circuit to produce a different (or additional) supply voltage (generally known as a drain-supply voltage $V_{DD}$), where $V_{DD}$ is passed to the bias circuit 120 via a second feedback signal. As before, in this example, both the first feedback signal and second feedback signal are part of the feedback signal 138. In general, a voltage-doubler circuit is an electronic circuit that charges capacitors using an input voltage (i.e., the drain-voltage 136) and switches these charges in such a way that produced an output voltage (i.e., the second feedback signal that is equal to $V_{DD}$) of the voltage-doubler circuit is approximately twice the input voltage. As an example, the feedback circuit 118 includes the voltage-doubler circuit that may be, or include, a charge pump doubling circuit having a charge pump. In general, a charge pump is a type of DC-to-DC converter circuit that utilizes capacitors for energetic charge storage to raise or lower voltage. Charge pumps are circuits that are capable of high efficiencies while being electrically simple circuits. As such, in this example, the voltage-doubler circuit is configured to receive the drain-voltage 136 from the drain 124 of the common-source transistor 106 and produce the second feedback signal, where the second feedback signal is equal to $V_{DD}$ that is approximately twice the drain-voltage 136. Again, in this example, both the first feedback signal and second feedback signal are part of the feedback signal 138.

The bias circuit 120 is a circuit, component, module, or device that receives the first feedback signal from the feedback signal 138 and produces the bias-voltage 140. The gate-voltage 142 is directly or indirectly produced from the bias-voltage 140 and the gate-voltage 142 is injected into the gate 130 of the common-gate transistor 104.

In this example, the driver circuit 144 may be a separate circuit, in signal communication with both the bias circuit 120 and the gate 130 of the common-gate transistor 104 via signal paths 132 and 141, respectively, or a circuit that is part of the bias circuit 120. The driver circuit 144 is configured to receive the bias-voltage 140, produce the first gate-voltage and the second gate-voltage, and inject either the first gate-voltage or second gate-voltage into the gate 130 of the common-gate transistor 104. The driver circuit 144 may include a switch that is configured to switch between the first gate-voltage and the second gate-voltage. If the driver circuit 144 is part of the bias circuit 120, the signal path 141 is the same as the signal path 132 since there is no separate driver circuit 144 present.

Figure 2:
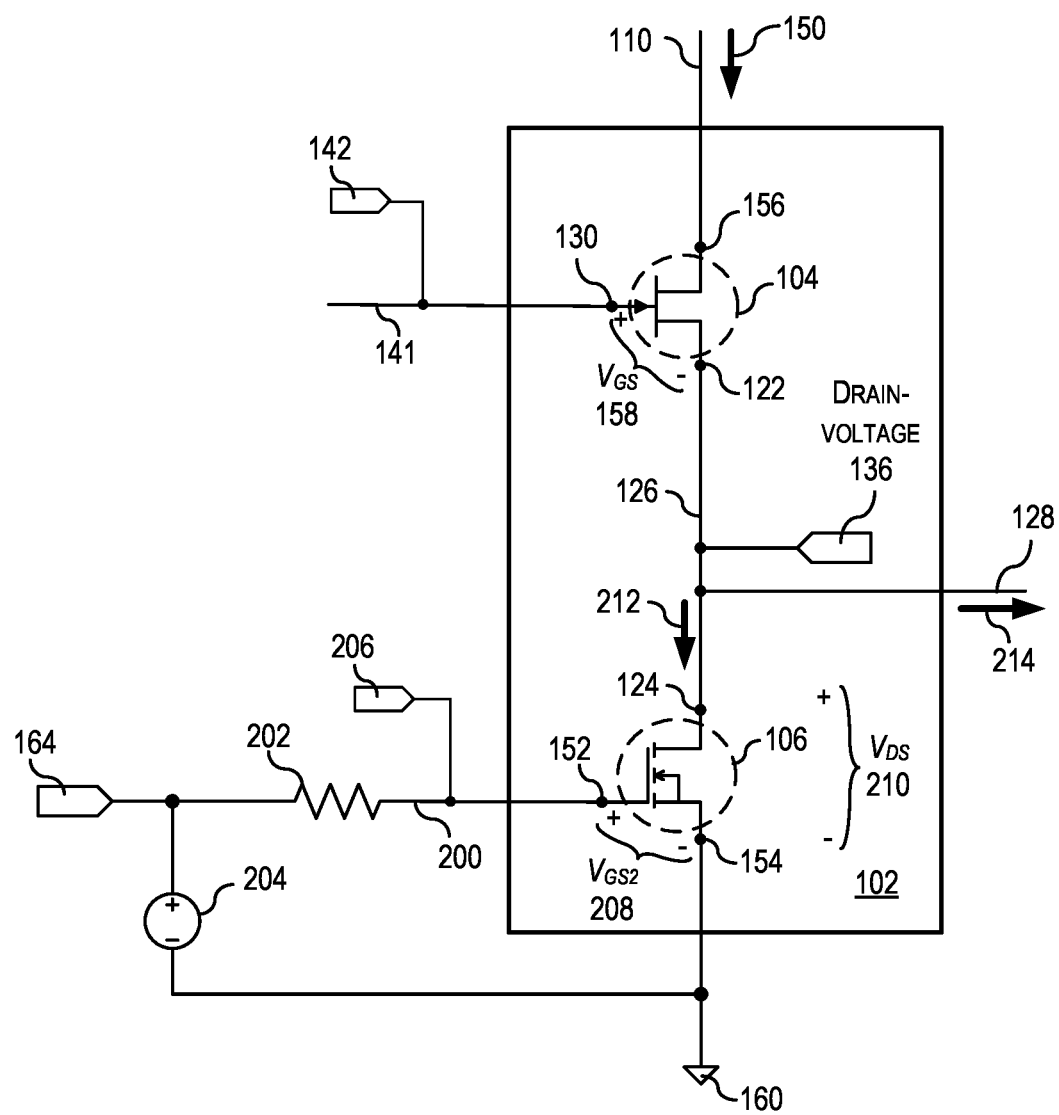
FIG. 2 is a circuit diagram of an example of an implementation of the cascode amplifier shown in FIG. 1 in accordance with the present disclosure.

In FIG. 2, a circuit diagram is shown of an example of an implementation of the cascode amplifier 102 in accordance with the present disclosure. As described earlier, the cascode amplifier 102 is a two-stage amplifier that includes a common-gate stage of the amplifier (i.e., the common-gate transistor 104) feeding into a common-source stage (i.e., the common-source transistor 106). The cascode amplifier 102 includes the common-gate transistor 104 and the common-source transistor 106 where the source 122 of the common-gate transistor 104 is in signal communication with the drain 124 of the common-source transistor 106. In this example, the common-gate transistor 104 is a "normally on" n-type JFET transistor and the common-source transistor 106 is an enhancement n-type MOSFET transistor. The feedback circuit 118 (shown in FIG. 1) is in signal communication with the cascode amplifier 102 via signal path 128, which is in signal path with both the source 122 of the common-gate transistor 104 and the drain 124 of the common-source transistor 106. In this example, the common-source transistor 106 is driven by a source that is a PWM source 164 that is in signal communication with the gate 152 of the common-source transistor 106 via signal path 200. The PWM source 164 may be in signal communication with a resistor 202 and a DC offset reference source 204, where the DC offset reference source 204 is in signal communication with the ground connection 160. As stated earlier, the gate 130 of the common-gate transistor 104 is in signal communication with the driver circuit 144 via signal path 141.

It is appreciated by those of ordinary skill in the art that in modern power supply designs, it is useful to switch the voltage and current utilized by a power supply (such as the power supply 148) in a manner that achieves a step down or step up in voltage. This switching creates a new average output voltage for the power supply 148 based on the duty cycle of the switching. In this example, the power supply 148 is mainly either in the ON state or the OFF state. During these two states, the power loss in the power supply 148 is a function of the current 150 flowing in the power supply 148 and the resistance of the power supply 148. In addition, the power supply 148 also experiences a "switching loss" associated with switching the power supply 148 from the ON state to the OFF state and from the OFF state back to the ON state. In general, this switching loss is caused by the voltage rising or falling within the power supply 148 while the current 150 is flowing in the power supply 148.

In this example, the switching of the power supply 148 between the ON state and OFF state is performed by the cascode amplifier 102 where the common-source transistor 106 is first switched off (i.e., switched to a first OFF state from an ON state) by the PWM source 164 that injects a PWM voltage 206 into the gate 152 of the common-source transistor 106. Since in this example the common-source transistor 106 is an enhancement mode n-type MOSFET, the common-source transistor 106 is switched off by injecting a signal that has a gate-to-source voltage ("$V_{GS2}$") 208 value that is less than a threshold voltage ("$V_{T2}$") value of the common-source transistor 106, where the common-source transistor 106 is pinched off and does not pass the current 212 (shown in FIG. 2 as a part of current 150) from the drain 124 to the source 154 of the common-source transistor 106. In this example, $V_{T2}$ may be equal to approximately between 5 to 7 volts based on the type of common-source transistor 106 utilized.

The source 154 of the common-source transistor 106 is grounded by the ground connection 160 and in an example of operation when the common-source transistor 106 is ON (i.e., in the ON state), the drain 124 of the common-source transistor 106 is approximately equal to the source 154 because the drain-to-source voltage ("VDs") is approximately equal to zero volts when the common-source transistor 106 is ON. As a result, the current 150 flows through cascode amplifier 102 where the current 150 initially flows through the drain 156 and source 122 of the common-gate transistor 104 towards the common-source transistor 106.

Once the current 150 flows through the source 122 of the common-gate transistor 104, a first part 212 of the current 150 flows through drain 124 and source 154 of the common-source transistor 106 to the ground connection 160 and a second part 214 of the current 150 flows to the feedback circuit 118 via signal path 128. In general, the first part 212 of the current 150 is larger than the second part 214 of the current 150.

When a PWM voltage 206 equal to or greater to $V_{T2}$ is injected into the gate 152 of the common-source transistor 106, the common-source transistor 106 is pinched off, switches to the first OFF state (i.e., turns off), and stops passing the first part 212 of the current 150 to the ground connection 160. As a result, the drain-voltage 136 at the drain 124 of the common-source transistor 106 floats and beings to rise from zero volts (the ground voltage at the ground connection 160) to a higher voltage as the first part 212 of the current 150 begins to charge the $C_{oss}$ of the MOSFET (i.e., the common-source transistor 106), where charging time of the $C_{oss}$ of the common-source transistor 106 governs the rise time of the drain-voltage 136.

It is noted that the voltage at the source 122 of the common-gate transistor 104 is also equal to the drain-voltage 136 because the source 122 of the common-gate transistor 104 is directly and electrically connected to the drain 124 of the common-source transistor 106. As such, the voltage at the source 122 of the common-gate transistor 104 is also rising.

With previous approaches, the gate-voltage 142 at the gate 130 of the common-gate transistor 104 would be zero volts because the gate 130 would be grounded. This would result in the voltage of the source 122 of the common-gate transistor 104 rising to a voltage value that is greater than the gate-voltage 142 until $V_{GS}$ 158 is equal to or greater than $V_T$ (in this example approximately 6 volts). Once the voltage of the source 122 of the common-gate transistor 104 reaches $V_T$, the common-gate transistor 104 will be pinched off and turn off. This process, however, will take a while because of the time it takes to charge the $C_{oss}$ of the common-source transistor 106 with the first part 212 of the current 150 to raise the drain-voltage 136 to VT.

Unlike the previous approaches, the present disclosure charges the $C_{oss}$ of the common-source transistor 106 faster to raise the drain-voltage 136 to $V_T$. The apparatus 100, instead, senses the rising drain-voltage 136 at the drain 124 of the common-source transistor 106 and correspondingly raises the first gate-voltage that is injected into the gate 130 of the common-gate transistor 104 as the gate-voltage 142. As such, the $V_{GS}$ 158 of the common-gate transistor 104 is kept above $V_T$ and the common-gate transistor 104 is kept in the ON state until the second gate-voltage is then injected into the gate 130 of the common-gate transistor 104 as the gate-voltage 142. The second gate-voltage is less than the first gate-voltage by a voltage amount that has a magnitude value that is equal to or greater than the $V_T$ of the common-gate transistor. In other words, since the first gate-voltage corresponds to the drain-voltage 136 and rises as the drain-voltage 136 rises, the second gate-voltage is equal to a voltage value that is at most equal to the first gate-voltage minus $V_T$ such that the resulting $V_{GS}$ 158 will be equal to at least a negative $V_T$ (for example −6 volts) to cause the common-gate transistor to become pinched off. As an example, the second gate-voltage may be equal to zero volts (i.e., the gate 130 of the common-gate transistor 104 may be grounded). By switching between the first and second gate-voltages, the apparatus 100 is configured to shut off (i.e., switch to a second OFF state) the common-gate transistor 104 faster than waiting for the $C_{oss}$ of the common-source transistor 106 to charge and raise the drain-voltage 136 to a voltage level above the gate-voltage 142 that would result in $V_{GS}$ 158 being equal to negative $V_T$ and pinching off the common-source transistor 106. This will result in lower switching loss for the apparatus 100 and correspondingly the power supply 148.

In general, switching between the first and second gate-voltages to shut off the common-gate transistor 104 may be done by a high speed comparator circuit that may be implemented to sense the rise of the drain-voltage 136 of the common-source transistor 106 and trigger the drive voltage (i.e., gate-voltage 142) low of the driver circuit 144 that is connected to the gate 130 of the common-gate transistor 104. As another example, the apparatus 100 may utilize a method that does not sense the drain-voltage 136 but, instead, relies on delays between two drive signals. The drive signals could have a fixed delay to get the desired switching results based on types of common-source transistor 106 and/or common-gate transistor 104, used or could be adaptively tuned by looking for an overlap time and tuning to an optimal delay. These desired results may be achieved by, for example, utilizing a standard PWM signal input and delaying the drive to the common-gate transistor 104 we can achieve the desired results. In this example, the PWM signal is driven to the common-source transistor 106 and the common-gate transistor 104. As a further example, the common-gate transistor 104 may utilize two buffer stages with a resistance to affect a delay to the gate 130 of the common-gate transistor 104.

Figure 3:
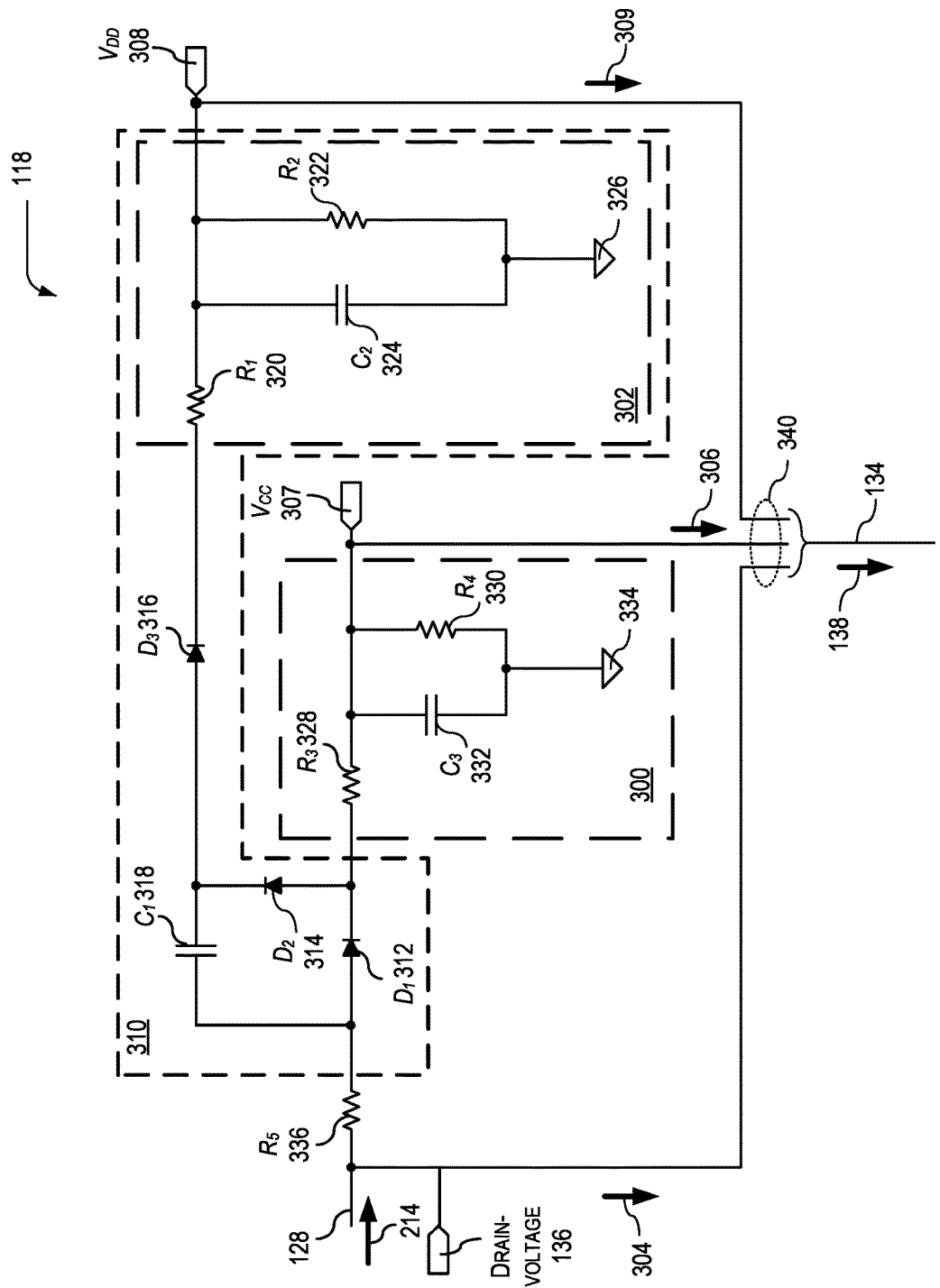
FIG. 3 is a circuit diagram of an example of an implementation of the feedback circuit shown in FIG. 1 in accordance with the present disclosure.

Turning to FIG. 3, a circuit diagram of an example of an implementation of the feedback circuit 118 is shown in accordance with the present disclosure. In this example, the feedback circuit 118 may include a first voltage-divider 300 and an optional second voltage-divider 302. As discussed earlier, the feedback circuit 118 is a circuit, component, module, or device that receives the drain-voltage 136, via signal path 128, and produces the feedback signal 138 that is passed to the bias circuit 120 via signal path 134. In this example, the feedback circuit 118 is a circuit that is configured to receive the drain-voltage 136 and produce a first feedback signal 304 and a second feedback signal 306. The feedback signal 138 includes both the first feedback signal 304 and second feedback signal 306. In general, the first feedback signal 304 is a signal that passes the drain-voltage 136 from the drain 124 of the common-source transistor 106 to the bias circuit 120 through the feedback circuit 118 and signal path 134. The feedback circuit 118 may include buffering circuitry (not shown) or other circuitry configured to receive the drain-voltage 136 and reliably pass the drain-voltage 136 to the bias circuit 120 without distortion or excessive attenuation.

The feedback circuit 118 is also configured to receive the drain-voltage 136 and produce a first supply voltage $V_{CC}$ 307 with the first voltage-divider 300. The $V_{CC}$ 307 is then passed to the bias circuit 120 as the second feedback signal 306 that is part of the feedback signal 138. Moreover, the feedback circuit 118 may also be configured to receive the drain-voltage 136 and produce a second supply voltage $V_{DD}$ 308 via the optional second voltage-divider 302. Based on the design of the apparatus 100, either the first supply voltage $V_{CC}$ 307 or the second supply voltage $V_{DD}$ 308 may be utilized as the second feedback signal 306 or 309 that is passed to the bias circuit 120 via the feedback signal 138.

In this example, the optional second voltage-divider 302 may be part of a voltage-doubler circuit 310. As an example, the voltage-doubler circuit 310 may include the optional second voltage-divider 302 and a first diode $D_1$ 312, second diode $D_2$ 314, third diode $D_3$ 316, and a first capacitor $C_1$ 318. The optional second voltage-divider 302 may include a first resistor $R_1$ 320, second resistor $R_2$ 322, a second capacitor $C_2$ 324, and a ground connection 326. The voltage-doubler circuit 310 is an electronic circuit that charges $C_1$ 318 from the input voltage (i.e., the drain-voltage 136) and switches this charge in such a way that the produced output voltage (i.e., $V_{DD}$ 308) of the voltage-doubler circuit 310 is approximately twice the input voltage (i.e., the drain-voltage 136) or, instead, optionally approximately twice $V_{CC}$ 306. In this example, the voltage-doubler circuit 310 is a charge pump voltage-doubler circuit. As a further example, the first voltage-divider 300 may include a third resistor $R_3$ 328, a fourth resistor $R_4$ 330, and third capacitor $C_3$ 332, and another ground connection 334. The feedback circuit 118 may also include a fifth resistor $R_5$ 336 in signal communication with the signal path 128 and the voltage-doubler circuit 310. In this example, $V_{CC}$ 307 or $V_{DD}$ 308 may be utilized to bias circuits, components, modules, or devices within the bias circuit 120 and/or provide reference voltages. In this example, the signal path 134 may include multiple signal paths 340 from either the drain-voltage 136, $V_{CC}$ 307, or $V_{DD}$ 308.

Figure 4:
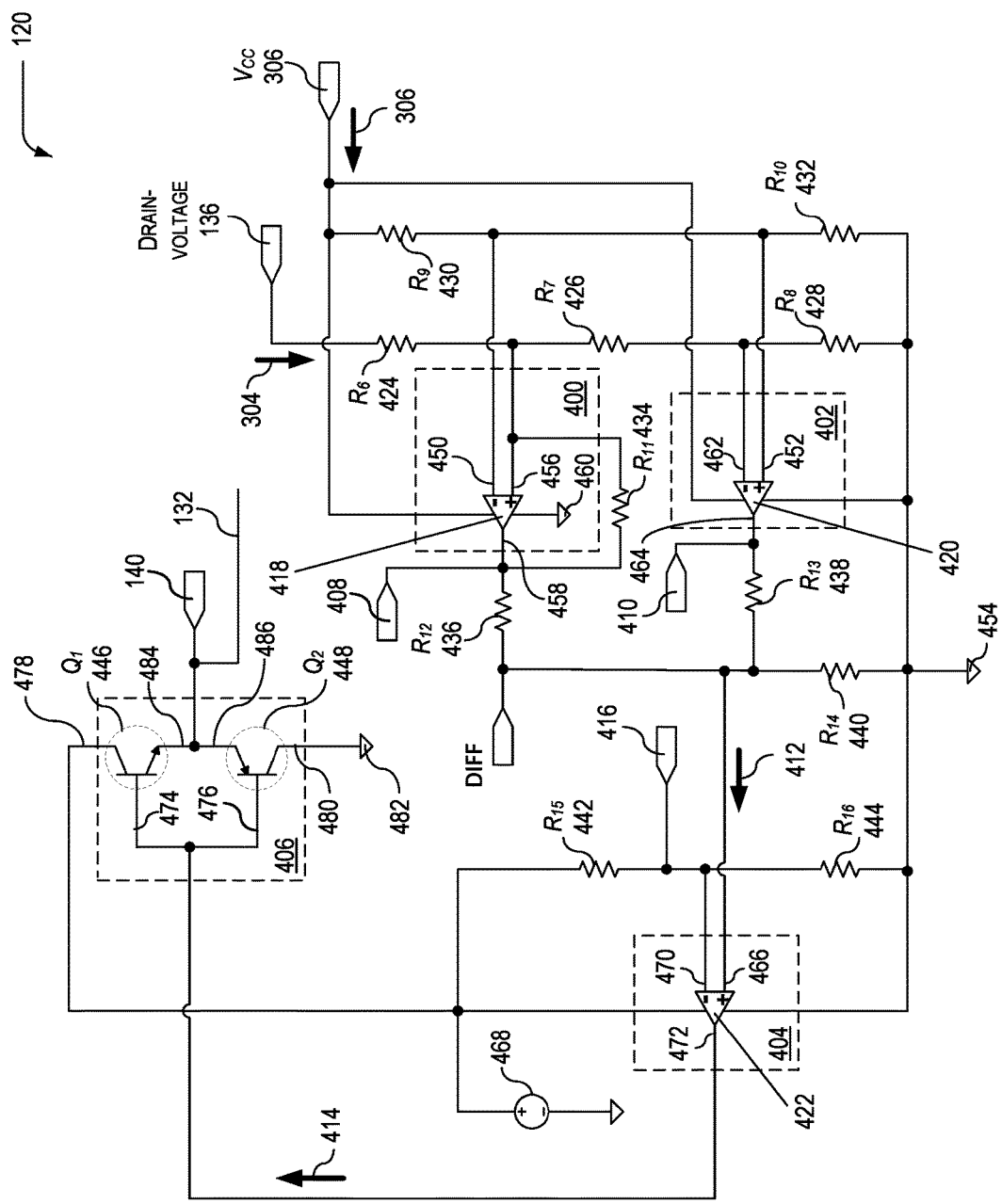
FIG. 4 is a circuit diagram of an example of an implementation of the bias circuit shown in FIG. 1 in accordance with the present disclosure.

In FIG. 4, a circuit diagram of an example of an implementation of the bias circuit 120 is shown in accordance with the present disclosure. As discussed earlier, the bias circuit 120 is a circuit, component, module, or device that receives the feedback signal 136 via signal path 134 and produces the bias-voltage 140. The bias circuit 120 includes a first difference amplifier 400, a second difference amplifier 402, a third difference amplifier 404, and a push-pull circuit 406. In this example, the first difference amplifier 400 is configured to compare the second feedback signal 306 against the first feedback signal 304 to produce a cascode-sensed-voltage 408. The second difference amplifier 402 is configured to compare the second feedback signal 306 against the first feedback signal 304 to produce a trigger voltage 410. The third difference amplifier 404 is configured to compare a combined signal 412 of the cascode-sensed-voltage 408 and the trigger voltage 410 against a reference voltage 416 to produce the bias-voltage 140. The bias-voltage 140 is produced by the push-pull circuit 406 after receiving an output signal 414 from the third difference amplifier 404. In this example, the first difference amplifier 400, the second difference amplifier 402, and the third difference amplifier 404 include a first operational amplifier ("op-amp") 418, a second op-amp 420, and a third op-amp 422, respectively.

In this example, the bias circuit 120 includes a sixth resistor $R_6$ 424, a seventh resistor $R_7$ 426, an eighth resistor $R_8$ 428, a ninth resistor $R_9$ 430, a tenth resistor $R_{10}$ 432, an eleventh resistor $R_{11}$ 434, a twelfth resistor $R_{12}$ 436, a thirteenth resistor $R_{13}$ 438, a fourteenth resistor $R_{14}$ 440, a fifteenth resistor $R_{15}$ 442, a sixteenth $R_{16}$ 444, a first transistor $Q_1$ 446, and a second transistor $Q_2$ 448. Moreover, in this example, $R_9$ 430 is in signal communication with $R_{10}$ 432, a negative input terminal 450 of the first op-amp 418, and a positive input terminal 452 of the second op-amp 420. $R_{10}$ 432 is also in signal communication with a ground connection 454. $R_6$ 424 is in signal communication with a positive input terminal 456 of the first op-amp 418, $R_7$ 426, and $R_{11}$ 434. $R_{11}$ 434 is in signal communication with the positive input terminal 456 and an output terminal 458 of the first op-amp 418 and $R_{12}$ 436. Rig 436 is also in signal communication with the output terminal 458 of the first op-amp 418. The first op-amp 418 is powered by $V_{CC}$ 306 and is connected to ground 460. Additionally, $R_7$ 426 is in signal communication with a negative input terminal 462 of the second op-amp 420 and $R_8$ 428. $R_8$ 428 is also in signal communication with the ground connection 454. An output terminal 464 of the second op-amp 420 is in signal communication with $R_{13}$ 438. The second op-amp 420 is also powered by $V_{CC}$ 306 and is connected to the ground connection 454. $R_{12}$ 436 and $R_{13}$ 438 are in signal communication with a positive input terminal 466 of the third op-amp 422 and $R_{14}$ 440. $R_{14}$ 440 is also in signal communication with the ground connection 454. The third op-amp 422 is powered by reference source 468 and is connected to ground connection 454. $R_{15}$ 442 is in signal communication with the reference source 468, a negative input terminal 470 of the third op-amp 422, and $R_{16}$ 444. $R_{16}$ 444 is also in signal communication with the ground connection 454.

An output terminal 472 of the third op-amp 422 is in signal communication with both a base 474 of $Q_1$ 446 and a base 476 of $Q_2$ 448 within the push-pull circuit 406. In this example, the $Q_1$ 446 is an npn-type BJT transistor and $Q_2$ 448 is a pnp-type BJT transistor and $Q_1$ 446 and $Q_2$ 448 are configured as emitter followers. In this example, the collector 478 of $Q_1$ 446 is in signal communication with the reference source 468 and the collector 480 of $Q_2$ 448 is in signal communication with a ground connection 482. The emitter 484 of $Q_1$ 446 and emitter 486 of $Q_2$ 448 are in signal communication with each other and driver circuit 144 via signal path 132. In operation, the push-pull circuit 406 receives the output signal 414 from the third op-amp 422 and produces the bias-voltage 140 that is passed to the driver circuit 144 via signal path 132.

Figure 5:
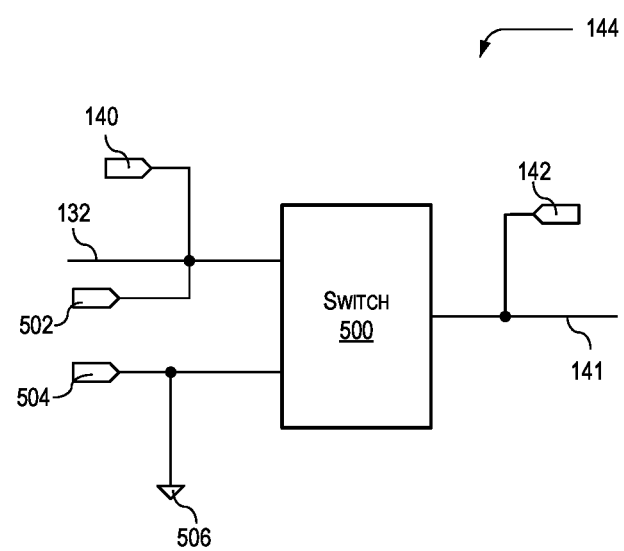
FIG. 5 is a circuit diagram of an example of an implementation of the driver circuit shown in FIG. 1 in accordance with the present disclosure.

In FIG. 5, a circuit diagram of an example of an implementation of the driver circuit 144 is shown in accordance with the present disclosure. In this example, the driver circuit 144 includes a switch 500 in signal communication with the bias circuit 120 via signal path 132 and gate 130 of the common-gate transistor 104 via signal path 141. The switch 500 is configured to receive and switch between a first gate-voltage 502 and second gate-voltage 504 to produce the gate-voltage 142 that is injected into the gate 130 of the common-gate transistor 104 via signal path 141. In this example, the first gate-voltage 502 is equal to the bias-voltage 140 and the second gate-voltage 504 is set to ground 506.

In an example of operation, the switch 500 selects the first gate-voltage 502 to inject, as the gate-voltage 142, into the gate 130 of the common-gate transistor 104 to allow the gate-voltage 142 to rise correspondingly to the rise in voltage of drain-voltage 136 at the drain 124 of the common-source transistor 106 when the common-source transistor 106 is switched to the first OFF state. The switch 500 then selects the second gate-voltage 504 to inject, as the gate-voltage 142, into the gate 130 of the common-gate transistor 104 to turn off (i.e., switch to the second OFF state) the common-gate transistor 104.

In this example, the cascode amplifier 102 driver (i.e., gate-voltage 142) for the common-gate transistor 104 is independent and is only controlled based on the switching of the common-source transistor 106. As an example, this can be achieved two ways: 1) monitor the drain-voltage 136 of the drain 124 of the common-source transistor 106 and at a predetermined level, trigger the pull down voltage of the gate 130 of the common-gate transistor 104; and 2) utilize a simple delay between the two gate-voltage 142 signals (overlap) at the gate 130 so as to achieve the same result.

Figure 6A:
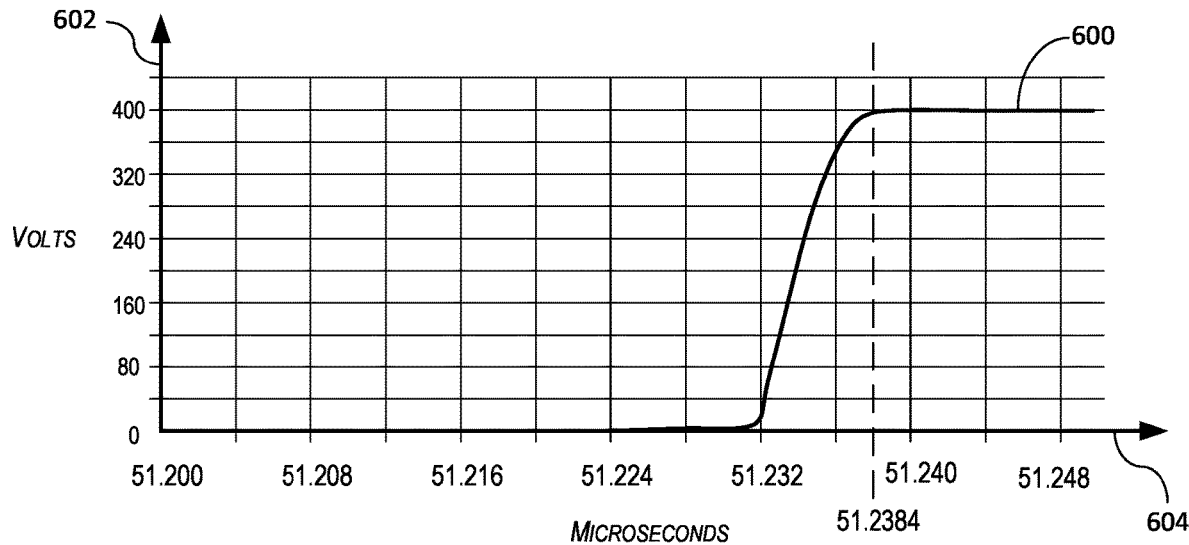
FIG. 6A is a graph of a plot of the drain-voltage at the drain of the common-gate transistor (shown in FIGS. 1 and 2) as voltage versus time in accordance with the present disclosure.

Turning to FIG. 6A, a graph is shown of a plot 600 of the drain-voltage at the drain 156 of the common-gate transistor 104 in voltage versus time in accordance with the present disclosure. In this example, the vertical axis 602 represent the magnitude in volts and the horizontal axis 604 represents the time in microseconds ("µs") where the vertical axis 602 ranges from 0 to 400 volts and the horizontal axis 604 ranges from 51.200 to 51.250 µs. In this example, the switch 500 of the driver circuit 144 constantly only selects the second gate-voltage 504 (where the second gate-voltage 504 is ground 506) for the gate-voltage 142 that is injected into the gate 130 of the common-gate transistor 104 and does not select the first gate-voltage 502. In this example, the drain-voltage at the drain 156 of the common-gate transistor 104 is approximately 0 volts until approximately 51.232 µs, where the drain-voltage begins to increase to approximately 400 volts at approximately 51.238 µs. In this example, the rise time of the drain-voltage at the drain 156 of the common-gate transistor 104 is approximately 6.4 nanoseconds ("ns").

Figure 6B:
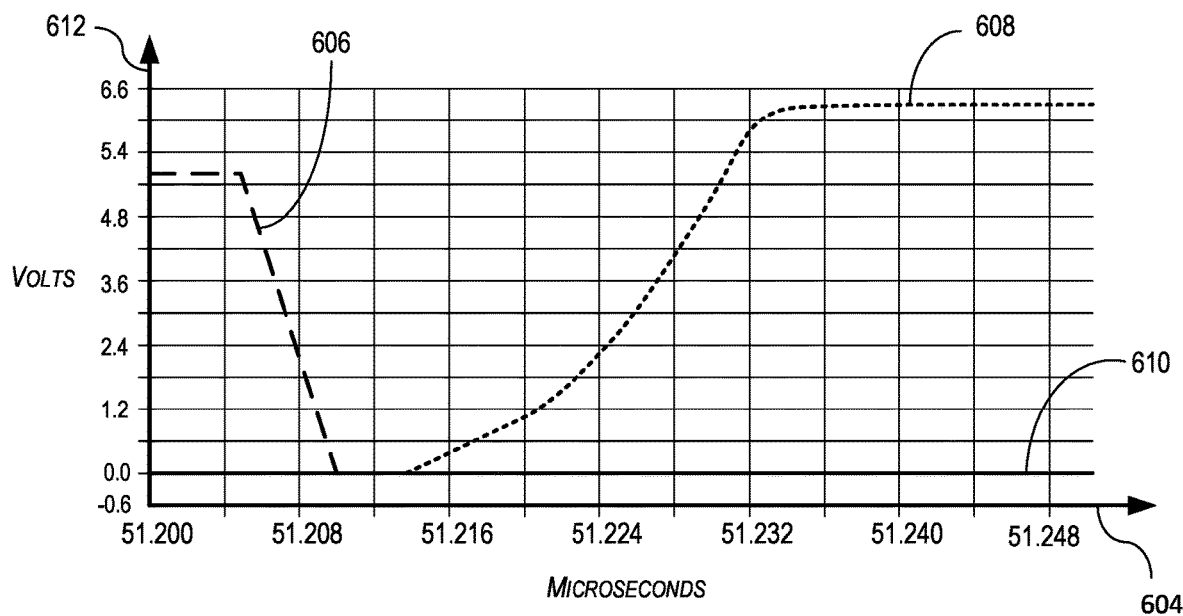
FIG. 6B is a graph of a first plot of the PWM source, second plot of the drain-voltage of the common-source transistor, and a third plot of the gate-voltage at the gate of the common-gate transistor (shown in FIGS. 1 and 2) as voltage versus time in accordance with the present disclosure.

In FIG. 6B, a graph is shown of a first plot 606 of the PWM source 164, second plot 608 of the drain-voltage 136 of the common-source transistor 106, and a third plot 610 of the gate-voltage 142 at the gate 130 of the common-gate transistor 104 in voltage versus time in accordance with the present disclosure. Similar to FIG. 6A, in this example, the vertical axis 612 represent the magnitude in volts and the horizontal axis 604 represents the time in microseconds ("µs") where the vertical axis 612 ranges from –0.6 to 6.6 volts and the horizontal axis 604 ranges from 51.200 to 51.250 µs. In this example, the first plot 606 of the PWM source 164 starts at approximately 5.2 volts at 51.200 µs and then drops to 0 volts after approximately 51.210 µs. As a result the second plot 608 of the drain-voltage 136 of the common-source transistor 106 starts at 0 volts and then at approximately 51.214 µs begins to rise until the drain-voltage 136 reaches approximately 6 volts. In this example, the third plot 610 shows that the gate-voltage 142 remains at 0 volts because the gate 130 of the common-gate transistor 104 is grounded.

Figure 7A:
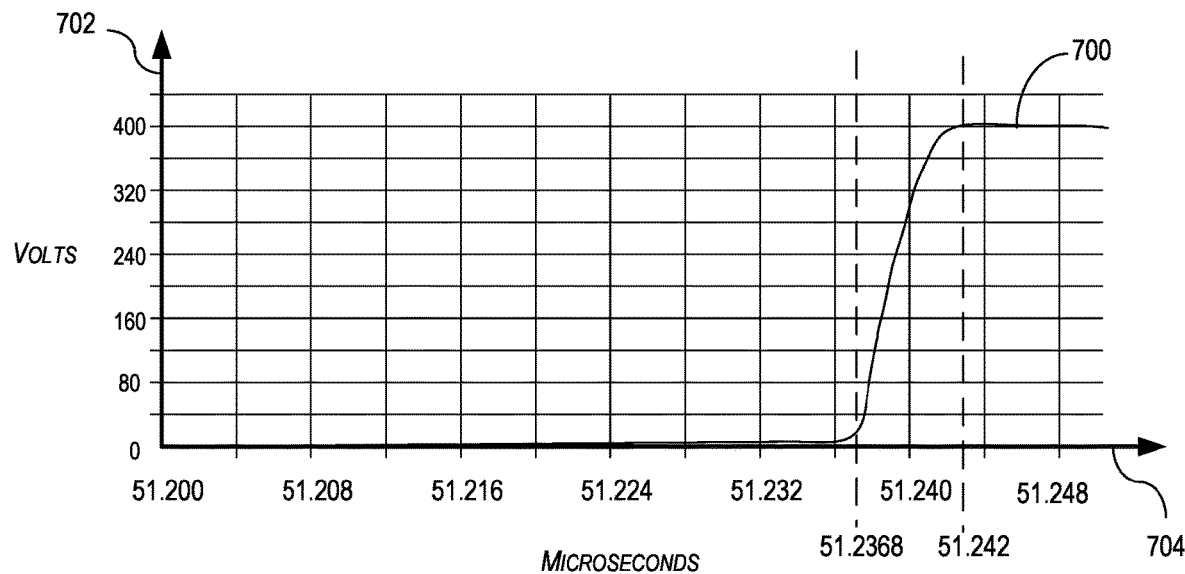
FIG. 7A is a graph of another plot of the drain-voltage at the drain of the common-gate transistor (shown in FIGS. 1 and 2) as voltage versus time in accordance with the present disclosure.

In FIG. 7A, a graph is shown of another plot 700 of the drain-voltage at the drain 156 of the common-gate transistor 104 in voltage versus time in accordance with the present disclosure. In this example, the vertical axis 702 represent the magnitude in volts and the horizontal axis 704 represents the time in microseconds where the vertical axis 702 ranges from 0 to 440 volts and the horizontal axis 704 ranges from 51.200 to 51.250 µs. In this example, the switch 500 of the driver circuit 144 selects both the first gate-voltage 502 and the second gate-voltage 504 (where the second gate-voltage 504 is ground 506) for the gate-voltage 142 that is injected into the gate 130 of the common-gate transistor 104 based on the bias-voltage 140 as described in relation to FIGS. 1 through 5. In this example, the drain-voltage at the drain 156 of the common-gate transistor 104 is approximately 0 volts until approximately 51.2368 µs, where the drain-voltage begins to increase to approximately 400 volts at approximately 51.242 µs. In this example, the rise time of the drain-voltage at the drain 156 of the common-gate transistor 104 is approximately 5.2 ns, which is about 20% less switching time than the 6.4 ns shown in the example of FIGS. 6A and 6B. This reduction in switching time results in reduced switching losses.

Figure 7B:
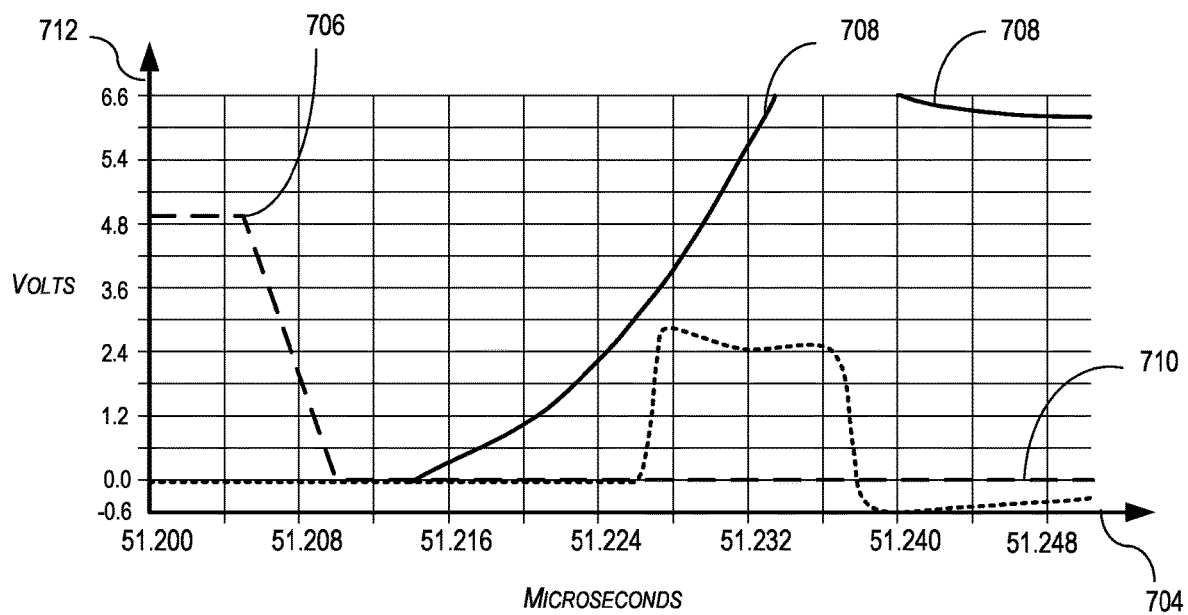
FIG. 7B is a graph of another first plot of the PWM source, another second plot of the drain-voltage of the common-source transistor, and another third plot of the gate-voltage at the gate of the common-gate transistor (shown in FIGS. 1 and 2) as voltage versus time in accordance with the present disclosure.

In FIG. 7B, a graph is shown of another first plot 706 of the PWM source 164, another second plot 708 of the drain-voltage 136 of the common-source transistor 106, and another third plot 710 of the gate-voltage 142 at the gate 130 of the common-gate transistor 104 in voltage versus time in accordance with the present disclosure. Similar to FIG. 7A, in this example, the vertical axis 712 represent the magnitude in volts and the horizontal axis 704 represents the time in microseconds where the vertical axis 712 ranges from –0.6 to 6.6 volts and the horizontal axis 704 ranges from 51.200 to 51.250 µs. In this example, the first plot 706 of the PWM source 164 starts at approximately 4.9 volts at 51.200 µs and then drops to 0 volts after approximately 51.210 µs. As a result the second plot 708 of the drain-voltage 136 of the common-source transistor 106 starts at 0 volts and then at approximately 51.214 µs begins to rise until the drain-voltage 136 reaches approximately 6.0 volts. Unlike the example shown in FIGS. 6A and 6B, in this example, the third plot 710 shows that the gate-voltage 142 remains at 0 volts until approximately 51.226 µs where the first gate-voltage 502 begins to rise to approximately 2.9 volts and then varies between 2.0 volts to approximately 2.5 volts at 51.236 µs where the switch 500 selects the second gate-voltage 504 and the gate-voltage 142 drops to –0.6 volts at approximately 51.238 µs and then begins to rise to level out at 0 volts.

Figure 8:
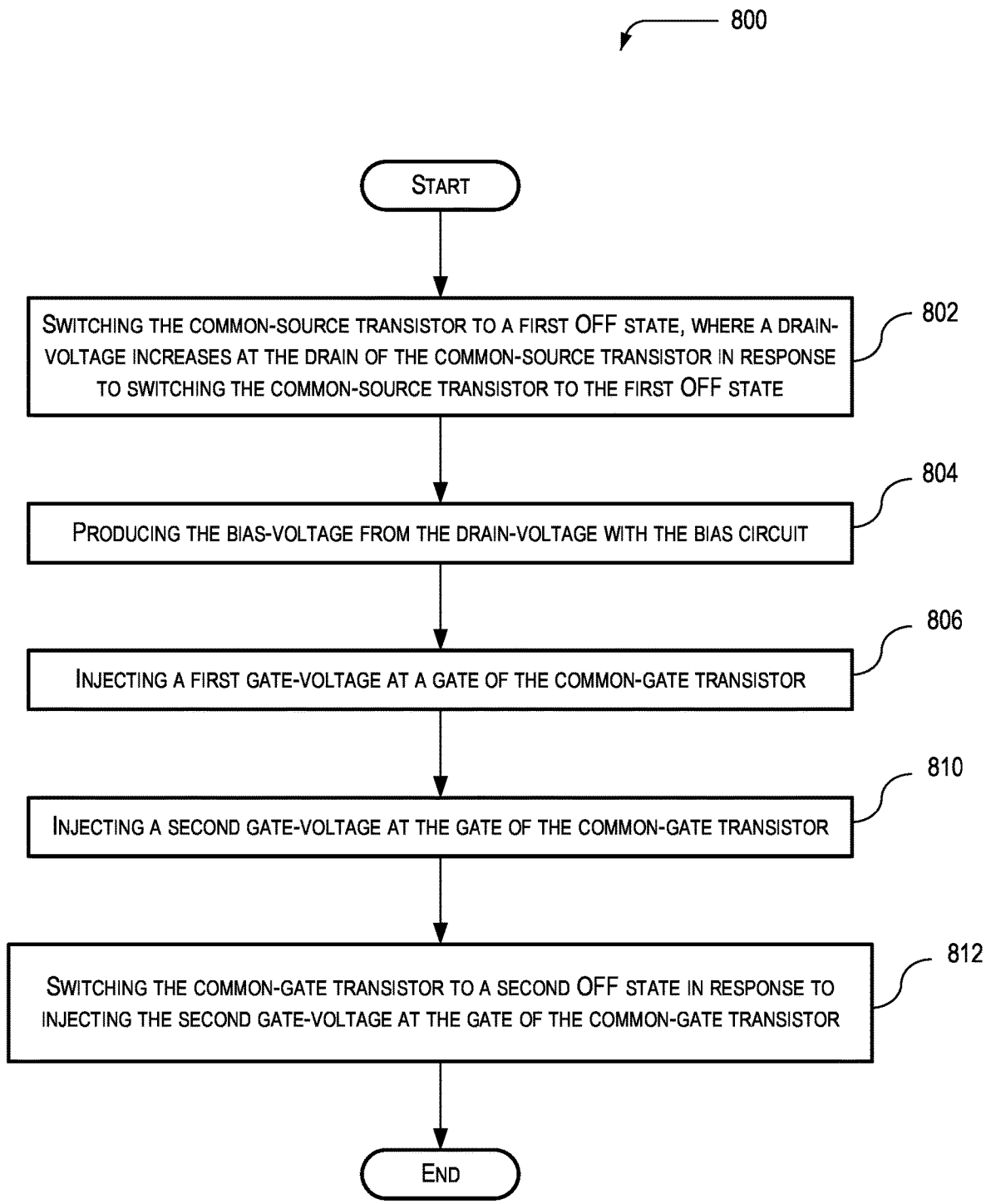
FIG. 8 is a flowchart of an example implementation of a method for performed by the apparatus shown in FIGS. 1-5 in accordance with the present disclosure.

Turning to FIG. 8, a flowchart is shown of an example of an implementation of a method 800 performed by the apparatus 100 in accordance with the present disclosure. The method 800 starts by switching 802 the common-source transistor 106 to a first OFF state, where a drain-voltage 136 increases at the drain 124 of the common-source transistor 106 in response to switching the common-source transistor 106 to the first OFF state. The method 800 then includes producing 804 the bias-voltage 140 from the drain-voltage 136 with the bias circuit 120 and injecting 806 the first gate-voltage 502 at a gate 130 of the common-gate transistor 104. Again, the first gate-voltage 502 is related to the bias-voltage 140 and the first gate-voltage 502 increases as the drain-voltage 136 increases. The method 800 then further includes injecting 810 the second gate-voltage 504 at the gate 130 of the common-gate transistor 104 and switching 812 the common-gate transistor 104 to the second OFF state in response to injecting the second gate-voltage 504 at the gate 130 of the common-gate transistor 104.

It will be understood that various aspects or details of the invention may be changed without departing from the scope of the invention. It is not exhaustive and does not limit the claimed inventions to the precise form disclosed. Furthermore, the foregoing description is for the purpose of illustration only, and not for the purpose of limitation. Modifications and variations are possible in light of the above description or may be acquired from practicing the invention. The claims and their equivalents define the scope of the invention.

In some alternative examples of implementations, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

The description of the different examples of implementations has been presented for purposes of illustration and description, and is not intended to be exhaustive or limited to the examples in the form disclosed. Many modifications and variations will be apparent to those of ordinary skill in the art. Further, different examples of implementations may provide different features as compared to other desirable examples. The example, or examples, selected are chosen and described in order to best explain the principles of the examples, the practical application, and to enable others of ordinary skill in the art to understand the disclosure for various examples with various modifications as are suited to the particular use contemplated.

Moreover, reference has been made in detail to examples of implementations of the disclosed invention, one or more examples of which have been illustrated in the accompanying figures. Each example has been provided by way of explanation of the present technology, not as a limitation of the present technology. In fact, while the specification has been described in detail with respect to specific examples of implementations of the invention, it will be appreciated that those skilled in the art, upon attaining an understanding of the foregoing, may readily conceive of alterations to, variations of, and equivalents to these examples of implementations. For instance, features illustrated or described as part of one example of an implementation may be used with example of another implementation to yield a still further example of an implementation. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. An apparatus comprising:
a bias circuit that produces a bias-voltage in response to a first feedback signal produced by a feedback circuit, the bias circuit being configured to be in signal communication with a gate of a common-gate transistor of a cascode amplifier;
wherein:
a first gate-voltage is produced from the bias-voltage and provided to the gate of the common-gate transistor;
the cascode amplifier has a common-source transistor;
a source of the common-gate transistor is in signal communication with a drain of the common-source transistor;
the feedback circuit is configured to receive a drain-voltage from the drain of the common-source transistor when the common-source transistor is switched to a first OFF state and to produce the first feedback signal;
the drain-voltage of the common-source transistor increases in response to switching the common-source transistor to the first OFF state;
the bias-voltage and the first gate-voltage increase as the drain-voltage of the common-source transistor increases;
the cascode amplifier is configured to receive a second gate-voltage at the gate of the common-gate transistor; and
the common-gate transistor is configured to switch to a second OFF state in response to receiving the second gate-voltage at the gate of the common-gate transistor.

2. The apparatus of claim 1, wherein a gate of the common-source transistor is in signal communication with a pulsed signal source.

3. The apparatus of claim 1, wherein the second gate-voltage is less than the first gate-voltage by a voltage amount that has a magnitude value that is equal to or greater than a threshold voltage value of the common-gate transistor.

4. The apparatus of claim 1, wherein the second gate-voltage is equal to ground.

5. The apparatus of claim 1, wherein a driver circuit is configured to receive the bias-voltage, produce the first gate-voltage and the second gate-voltage, and inject either the first gate-voltage or the second gate-voltage into the gate of the common-gate transistor.

6. The apparatus of claim 1, wherein:
the feedback circuit is configured to produce a second feedback signal; and
the second feedback signal has a voltage value that is equal to approximately twice the drain-voltage.

7. The apparatus of claim 6, wherein the bias circuit comprises:
a first difference amplifier that is configured to compare the second feedback signal against the first feedback signal to produce a cascode-sensed-voltage;
a second difference amplifier that is configured to compare the second feedback signal against the first feedback signal to produce a trigger voltage; and
a third difference amplifier that is configured to compare a combined signal of the cascode-sensed-voltage and the trigger voltage against a reference voltage to produce the bias-voltage.

8. The apparatus of claim 7, wherein the first difference amplifier, the second difference amplifier, and the third difference amplifier each include an operation amplifier.

9. The apparatus of claim 8, wherein a driver circuit is configured to receive the bias-voltage, produce the first gate-voltage and the second gate-voltage, and inject either the first gate-voltage or the second gate-voltage into the gate of the common-gate transistor.

10. The apparatus of claim 1, wherein the common-gate transistor is a junction field-effect transistor.

11. The apparatus of claim 10, wherein the common-source transistor is a metal-oxide-semiconductor field-effect transistor.

* * * * *